United States Patent [19]
Chen et al.

[11] Patent Number: 5,745,408
[45] Date of Patent: Apr. 28, 1998

[54] MULTI-LAYER MAGNETIC MEMORY CELL WITH LOW SWITCHING CURRENT

[75] Inventors: Eugene Chen, Gilbert; Saied N. Tehrani; Herbert Goronkin, both of Tempe, all of Ariz.

[73] Assignee: Motorola, Inc., Schaumburg, Ill.

[21] Appl. No.: 709,589

[22] Filed: Sep. 9, 1996

[51] Int. Cl.[6] ................................................ G11C 11/15
[52] U.S. Cl. .......................... 365/173; 365/171; 365/158
[58] Field of Search .................................. 365/173, 171, 365/158

[56] References Cited

U.S. PATENT DOCUMENTS

| | | | |
|---|---|---|---|
| 4,547,866 | 10/1985 | Lutes et al. | 365/173 |
| 4,780,848 | 10/1988 | Daughton et al. | 365/173 |
| 5,343,422 | 8/1994 | Kung et al. | 365/173 |

*Primary Examiner*—David C. Nelms
*Assistant Examiner*—Andrew Q Tran
*Attorney, Agent, or Firm*—Eugene A. Parsons

[57] ABSTRACT

A multi-layer magnetic memory cell including two similar layers of magnetic material stacked in parallel, overlying relationship and separated by a layer of non-magnetic material. Each of the two similar layers have a width that is less than a width of magnetic domain walls within the layer of magnetic material so that magnetic vectors in the two similar layers point along the length thereof. The two similar layers define a central plane parallel with the two similar layers symmetrically formed and positioned thereabout. Magnetic vectors in the two similar layers are switched simultaneously and the two similar layers are positioned close enough together to allow mutual cancellation of pole effects during simultaneous switching of the magnetic vectors.

16 Claims, 2 Drawing Sheets

MULTI-LAYER MAGNETIC MEMORY CELL WITH LOW SWITCHING CURRENT

FIELD OF THE INVENTION

The present invention pertains to memory cells and more specifically to multi-layer magnetic memory cells with low switching current.

BACKGROUND OF THE INVENTION

In the past, a variety of magnetic materials and structures have been utilized to form magnetoresistive materials for non-volatile memory elements, read/write heads for disk drives, and other magnetic type applications. One prior magnetoresistive element utilized a magnetoresistive material that has two magnetic layers separated by an interlayer. The magnetization vectors of the two magnetic layers typically are anti-parallel to each other in the absence of any magnetic fields. The magnetization vectors of one of the layers points in one direction and the magnetization vector of the other layer always points in the opposite direction. The magnetic characteristics of such magnetic materials typically require a width greater than one micron in order to maintain the orientation of the magnetization vectors along the width of the cell. The large width requirement limits the density of memories utilizing such materials. Additionally, reading the state of such memories typically requires a two-phase read operation that results in very long read cycles. The two phase read operation also requires extra circuitry to determine the state of the memory, thus increasing the cost of such memories. An example of such a magnetic material and memory is disclosed in U.S. Pat. No. 4,780,848 issued to Daughton et al. on Oct. 25, 1988.

Another prior material uses multi-layer giant magnetoresistive materials (GMR) and utilizes submicron widths, in order to increase density. A conductive layer is disposed between the magnetic layers in the giant magnetoresistive material. In this structure the magnetization vectors are parallel to the length of the magnetic material instead of the width. In one embodiment the magnetization vector of one magnetic material layer is always maintained in one direction while the magnetization vector of the second magnetic layer switches between parallel and antiparallel to the first vector in order to represent both logical "0" and "1" states. In order to determine the logical state of a memory cell utilizing this material, the memory cell has a reference cell and an active cell. The reference cell always provides a voltage corresponding to one state (either always a "1" or always a "0"). The output of the reference cell is compared to the output of the active cell in order to determine the state of the memory cell. The requirement for an active and a reference cell reduces the density of a memory that utilizes such elements. Additionally, each memory cell requires transistors to switch the active and reference cells at appropriate times in order to read the cells. This further increases the cost of the memory.

A magnetic random access memory (MRAM) is a non-volatile memory which basically includes a giant magnetoresistive (GMR) material, a sense line, and a word line. The MRAM employs magnetic vector direction to store memory states, and the GMR effect to detect memory states. Magnetic vectors in one or all of the layers of GMR material are switched very quickly from one direction to an opposite direction when a magnetic field is applied to the GMR material over a certain threshold. According to the direction of the magnetic vectors in the GMR material, states are stored, for example, one direction can be defined as a logic "0", and another direction can be defined as a logic "1". The GMR material maintains these states even without a magnetic field being applied. In this type of device the sense current passes through the cell along its length direction. The states stored in the GMR material can be read by a sense line. That is, the magnetic vectors in the GMR material cause a different current flow with constant voltage supply or a different voltage with constant current supply in the sense line because of a different magneto-resistance (along the cell length direction) due to the direction of the magnetic vectors. Because the cell is made of metallic thin films with a conductive interlayer (generally copper or the like), the resistance of the cell is relatively low (e.g. 80 ohms) and the change in resistance is relatively small (e.g. 1.5%–5%).

A word line is typically a single metal line which is placed on top or bottom of the GMR material. In order to alternate the states in the various layers of GMR material, a word current of higher than 10 mA may be required in high density MRAM arrays. This current consumes much power and prevents MRAM arrays from becoming a strong candidate for portable applications.

Accordingly, it is highly desirable to provide magnetic random access memories and memory cells which require smaller currents in order to perform the switching or writing function.

It is a purpose of the present invention to provide a new and improved multi-state, multi-layer magnetic memory cell.

It is another purpose of the present invention to provide a new and improved multi-state, multi-layer magnetic memory cell which utilizes less writing current.

It is a further purpose of the present invention to provide a new and improved multi-state, multi-layer magnetic memory cell which is simpler to use.

SUMMARY OF THE INVENTION

The above problems and others are at least partially solved and the above purposes and others are realized in a multi-state, multi-layer magnetic memory cell including a plurality of layers of magnetic material stacked in parallel, overlying relationship and separated by layers of non-magnetic material. The stacked layers define a central plane parallel with the stacked layers and the plurality of layers of magnetic material are formed and positioned on either side of the central plane so as to form a symmetrical stack about the central plane.

The above problems and others are at least partially solved and the above purposes and others are further realized in a multi-state, multi-layer magnetic memory cell including two substantially similar layers of magnetic material positioned in parallel, overlying relationship and separated by a layer of non-magnetic material. The two substantially similar layers define a central plane parallel with the two substantially similar layers and are formed and positioned symmetrically on either side of the central plane.

DESCRIPTION OF THE PREFERRED EMBODIMENTS

Figure 1:
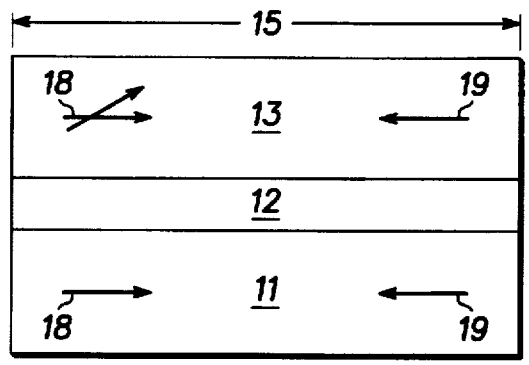
FIG. 1 is a simplified side view of a multi-layer magnetic memory cell.
Figure 2:
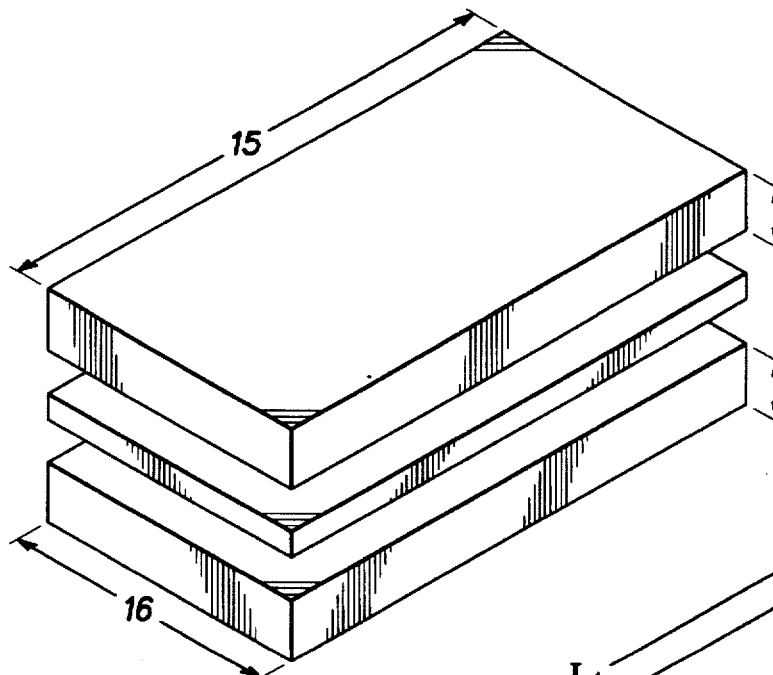
FIG. 2 is a simplified exploded view of the multi-layer magnetic memory cell illustrated in FIG. 1.

Turning now to the drawings, FIGS. 1 and 2 illustrate an enlarged, simplified side view and exploded view, respectively, of a magnetic memory cell 10 having two layers that are ferromagnetically coupled. Cell 10 includes a first magnetic layer 11 and a second magnetic layer 13, which are separated by a non-magnetic spacer layer 12. Layers 11 and 13 are rectangular and are formed with the easy axis of magnetization along a length 15 and not along a width 16. Layers 11 and 13 have magnetic or magnetization vectors 18 and 19, that are positioned substantially along length 15, that is, substantially parallel to length 15. Additionally width 16 is formed to be smaller than the width of the magnetic domain walls or transition width within layers 11 and 13. Consequently, vectors 18 and 19 can not be parallel to width 16 in the at rest state.

As illustrated in FIG. 1, vectors 18 and 19 in layers 11 and 13 represent two different states of magnetization within cell 10. It should be understood that these are the same vectors and that they are given different numbers only to indicate different states. One state is referred to as a logic "0" and the other state is a logic "1". While it will be understood by those skilled in the art that any logic definition can be assigned to either state, in this example when vectors 18 of layers 11 and 13 both point to the right in FIG. 1, cell 10 is in a logic ITOTT state and when vectors 19 in both layers 11 and 13 are in the opposite direction cell 10 is in a logic "1" state. Thus, for a first state magnetization vectors in both layers 11 and 13 point in a first direction and for a second state magnetization vectors in both layers 11 and 13 point in an opposite direction. Also, because layers 11 and 13 are ferromagnetically coupled the magnetic vectors of layers 11 and 13 are always pointing in the same direction (parallel) when no (or a very small) magnetic field is applied to cell 10. The magnetic vectors are only pointing in opposite directions (antiparallel) when specific magnetic fields are applied to cell 10, as will be explained in more detail presently.

In this specific example, cell 10 is designed so that the magnetization vectors in layer 13 can be switched much more easily than the magnetization vectors in layer 11. For example, one way in which this design is accomplished is to fabricate layer 13 much thinner than layer 11 (as shown in FIG. 1) so that a smaller magnetic field will switch the magnetization vectors of layer 13 than is required to switch the magnetization vectors of layer 11. Another way to accomplish this design is to form layer 11 out of magnetic material that requires a higher magnetic field to switch the magnetization vectors.

In any case, as the magnetic field on cell 10 is increased, vector 18 begins to rotate toward a lateral direction, as illustrated in FIG. 1. This rotation of vector 18 is opposed or countered by the self-demagnetizing field of layer 13 due to the magnetic poles generated on the sides of layer 13, which characteristic is referred to as "pole effect" herein because it is an effect produced by the magnetic poles produced in the magnetic layer. When the memory cell width is reduced, the pole effect (demagnetizing effect) increases and a relatively large magnetic field is required to perform the action of switching cell 10 from one magnetic state to the other. The pole effect can also be viewed as an accumulation of magnetic poles along the sides of the magnetic layers when the magnetization turns during a switching procedure.

Figure 3:
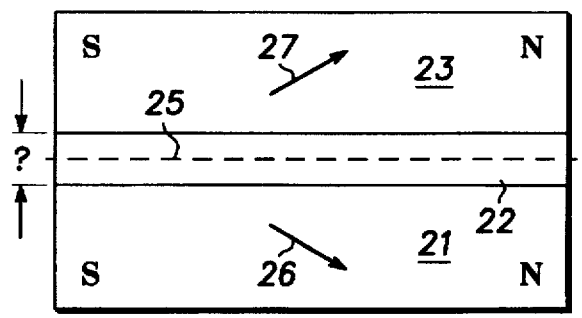
FIG. 3 is a simplified side view of a multi-layer magnetic memory cell in accordance with the present invention.
Figure 4:
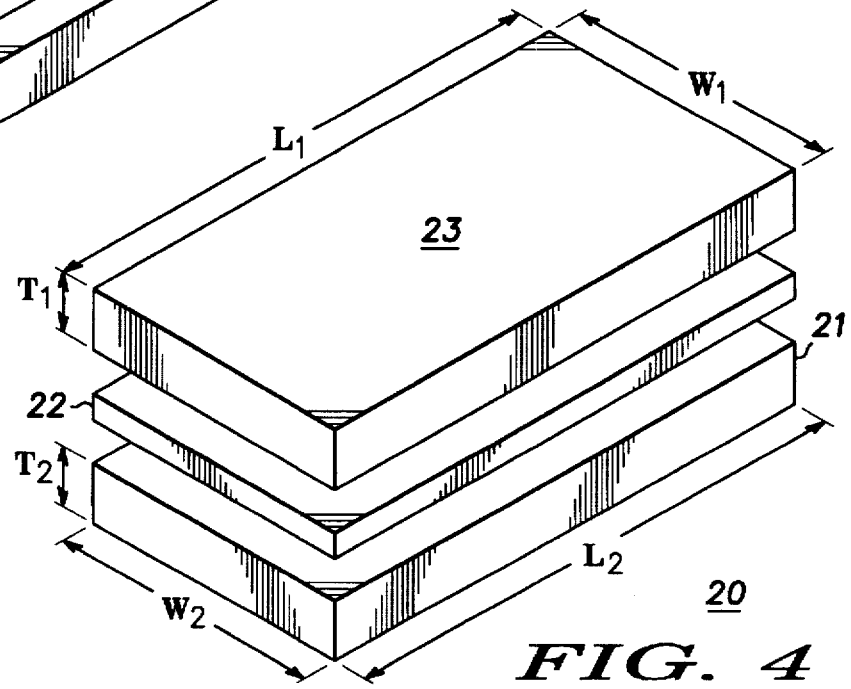
FIG. 4 is a simplified exploded view of the multi-layer magnetic memory cell illustrated in FIG. 3.

Turning now to FIGS. 3 and 4, an enlarged, simplified side view and exploded view, respectively, are illustrated of a magnetic memory cell 20 having multiple layers that are ferromagnetically coupled. Cell 20 includes a first magnetic layer 21 and a second magnetic layer 23, which are separated by a non-magnetic spacer layer 22. Magnetic layers 21 and 23 each can be single layers of ferromagnetic materials such as a layer of nickel, iron, cobalt, or alloys thereof. Alternatively, either of layers 21 and 23 can be a composite ferromagnetic layer, such as a layer of nickel-iron-cobalt covering a layer of cobalt-iron or three layer structures including layers of cobalt-iron and nickel-iron-cobalt and cobalt-iron with cobalt-iron at the interface with adjacent layers. Materials that are suitable for layer 22 depend upon the type of magnetic memory cell being fabricated. In a ferromagnetically-coupled magnetic memory cell utilizing an electrically conductive spacer layer, layer 22 may be, for example, any conductive, non-magnetic material such as copper, copper alloys, chromium, chromium alloys, etc. In a tunneling junction magnetic memory cell, layer 22 may include most non-conductive materials such as oxides, nitrides, dielectrics, etc.

In the preferred embodiment, layers 21 and 23 are rectangular and are formed with the easy axis of magnetization along a length L and not along a width W. Layers 21 and 23 have magnetization vectors 26 and 27, respectively, that are positioned substantially along length L, that is, substantially parallel to length L. Additionally width W is formed to be smaller than the width of the magnetic domain walls or transition width within layers 21 and 23. Consequently, vectors 26 and 27 can not be parallel to width W in the at rest state. Typically, widths of less than 1.0 to 1.2 microns result in such a constraint. In the preferred embodiment, width W is less than one micron and is as small as can be made by manufacturing technology, and length L is greater than width W, generally five times or greater. Also in the preferred embodiment, thickness T is approximately three to six nanometers.

In this embodiment, for reasons that will be explained presently, layers 21 and 23 are substantially similar. Also, in this embodiment, layers 21 and 23 are formed of the same material and have dimensions (length, width, thickness) that are as close as can be practically provided. Substantially similar layers 21 and 23 define a central plane 25 parallel with substantially similar layers 21 and 23. As illustrated most clearly in FIG. 3, substantially similar layers 21 and 23 are formed and positioned symmetrically on either side of central plane 25. Each layer 21 and 23 has a magnetization vector 26 and 27, respectively, in parallel with the longitudinal axis thereof.

Because layers 21 and 23 are substantially similar, magnetization vectors 26 and 27 are substantially equal and change directions (switch) simultaneously. Further, because magnetization vectors 26 and 27 are substantially equal, when a magnetic field is applied to cell 20 and vectors 26 and 27 begin to rotate in a lateral direction (as illustrated in FIG. 3) prior to the complete switching action, mutual cancellation of pole effects occurs. This mutual cancellation of the pole effects occurs because both magnetization vectors rotate simultaneously and in opposite directions. Also, since the pole effect can be viewed as an accumulation of poles along the sides of the magnetic layers during the switching procedure, the cancellation of the pole effect can be viewed as a reduction of the pole accumulation or density by creating magnetic flux closure paths in and between magnetic layers. These flux closure paths are created by the symmetrical formation and positioning of the magnetic layers about the central plane. Because of the mutual cancellation of the pole effects, a much smaller magnetic field is required to perform the switching function and, consequently, a much smaller switching or writing current is required.

Also, substantially similar layers 21 and 23 are positioned as close together as practical while still allowing spacer layer 22 to perform its functions. When layers 21 and 23 are very close, 100 Å or less, the pole effect is very small and a relatively small magnetic field (word current) is required to perform switching functions. As the distance between layers 21 and 23 is increased, the mutual cancellation effect becomes smaller, that is, each layer begins to act as though it were a separate layer, rather than a pair of adjacent layers. Also, as the similarity and symmetrical positioning of layers 21 and 23 are altered or the fabrication tolerances are increased (i.e. as the similarity between vectors 26 and 27 decreases) the pole effect cancellation decreases.

While the embodiment illustrated in FIGS. 3 and 4 incorporates substantially similar layers 21 and 23 of magnetic material, it should be understood by those skilled in the art that any cancellation of the pole effects will reduce the required writing current. In many applications a somewhat larger writing current may be tolerated. Thus, the term "substantially similar" is intended to include any pair of magnetic layers which are positioned adjacent to each other to reduce the pole effect and which do reduce the pole effect for a specific application.

Further, in some specific applications symmetrical magnetization vectors with similar characteristics (i.e. strength, etc.) may be produced in somewhat different materials, resulting in different sizes of layers. Generally, if the layers are designed to reduce pole effects in a magnetic memory cell as taught by this disclosure, the embodiment comes within this disclosure and the claims appended hereto. Further, while cell 20 is described as a complete cell with only three layers for simplicity of explanation, it should be understood that cell 20 can be used as an element of memory cells with more layers to serve as a low switching layer or element.

Figure 5:
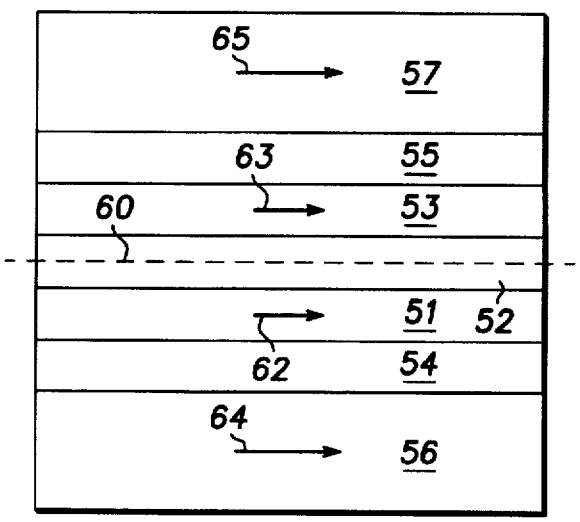
FIG. 5 is a simplified side view of another embodiment of a multi-layer magnetic memory cell in accordance with the present invention.

Turning now to FIG. 5, another embodiment of a multi-layer magnetic memory cell 50, which may be considered as containing cell 20 as an element thereof, is illustrated. Cell 50 includes a pair of layers 51 and 53 formed of magnetic material and separated by a layer 52 of non-magnetic material, which may be electrically conducting material or insulating material, depending upon the type of memory cell being utilized. A pair of non-magnetic layers 54 and 55 are positioned to sandwich magnetic layers 51 and 53 therebetween and a second pair of magnetic layers 56 and 57 are positioned with layers 54 and 55 sandwiched therebetween so as to form a stack of alternating magnetic and non-magnetic layers. Layers 51 through 57 are positioned so as to define a central plane 60 through the stack substantially parallel with the various layers. Further, layers 51, 54 and 56 are substantially similar to layers 53, 55 and 57 so that the layers are formed and positioned symmetrically on either side of central plane 60.

Magnetization vectors 62, 63, 64, and 65 for layers 51, 53, 56, and 57 are illustrated in FIGS. 5 through 10. The magnetic vectors in FIGS. 6 through 10 are the same as the vectors illustrated in FIG. 5, but the structure is removed for simplicity. A series of vector diagrams are illustrated in FIGS. 6 through 10 showing a logic "1" state in FIG. 6, a logic "0" state in FIG. 8 or FIG. 10 and switching from Logic state "1" to logic state "0" in FIG. 7 or FIG. 9. As represented by the vectors, layers 56 and 57 are thicker than layers 51 and 53 (and/or are formed of different material) and, thus, require a higher magnetic field to switch states. In the switching process from the "1" state in FIG. 6, through the intermediate state in FIG. 7, to the "0" state in FIG. 8, only a magnetic field sufficient to switch layers 51 and 53 is applied to cell 50. Whereas, in the switching process from the "1" state in FIG. 6 to the "0" state in FIG. 10, a magnetic field sufficient to switch layers 56 and 57 is applied to cell 50.

Figure 6:
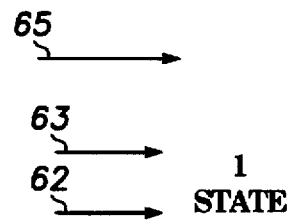
FIGS. 6 through 10 illustrate various magnetic vector orientations in the multi-layer magnetic memory cell of FIG. 5.
Figure 7:
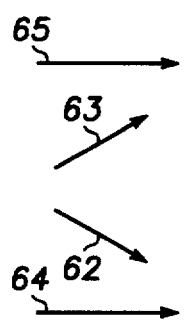

Referring specifically to FIG. 6, all of vectors 62 through 65 are in the same direction and cell 50 is in a state defined herein as a logic "1". As illustrated in FIG. 7, when a magnetic field is applied to cell 50 which is strong enough to switch the magnetization of layers 51 and 53 (but not layers 56 and 57), vectors 62 and 63 begin to rotate in opposite directions and, since vectors 62 and 63 have substantially similar characteristics, pole effects are substantially eliminated. With the pole effects substantially eliminated, the magnetic field required to snap vectors 62 and 63 completely around and switch cell 50 into the logic state "0" illustrated in FIG. 8 becomes much smaller. As will be understood, when the magnetic field required to switch states in cell 50 becomes smaller the current required to produce the magnetic field becomes much smaller. Similarly, when a magnetic field is applied to cell 50 which is strong enough to switch the magnetization of layers 56 and 57, vectors 62, 63, 64, and 65 begin to rotate in opposite directions. Since vectors 62 and 63, and vectors 64 and 65 have substantially similar characteristics, pole effects are substantially eliminated and the magnetic field required for the switching action is smaller.

Figure 11:
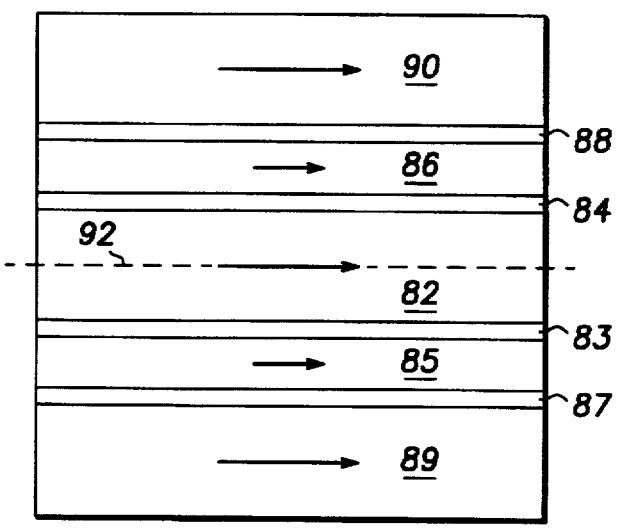
FIG. 11 is a simplified side view of yet another embodiment of a multi-layer magnetic memory cell in accordance with the present invention.
Figure 8:
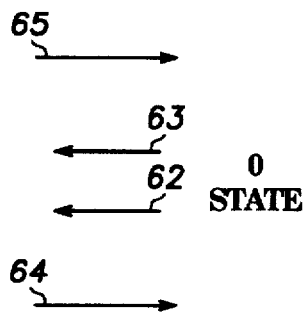
Figure 10:
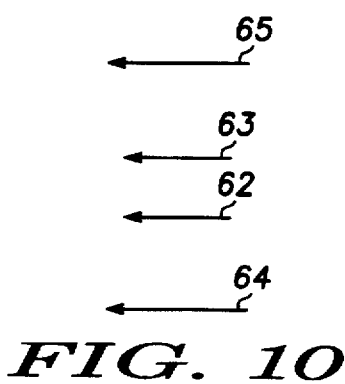
Figure 9:
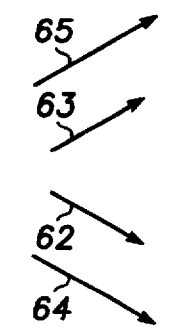

Turning now to FIG. 11, a somewhat different embodiment of a multi-layer magnetic memory cell 80 is illustrated in which a central relatively thick magnetic layer 82 is sandwiched between non-magnetic layers 83 and 84. Magnetic layers 85 and 86 are positioned on either side of non-magnetic layers 83 and 84, with non-magnetic layers 87 and 88 on either side thereof and magnetic layers 89 and 90 positioned to sandwich the entire stack therebetween. Layers 82 through 90 are formed and positioned to define a central plane 92 parallel with the various layers and extending through layer 82 so that all of the layers are symmetrical thereabout.

In the embodiment of FIG. 11, alternate thin and thick layers of magnetic material are provided with all of the magnetic layers being separated by non-magnetic layers. Further, magnetic fields applied to cell 80 are generally only high enough to switch the magnetization vectors of the thin layers (layers 85 and 86) while the magnetization vectors in the thick layers remain in an initial position. While the magnetic layers being switched are further apart in this embodiment, there will still be some cancellation of pole effects and, as in the other embodiments disclosed, an additional current reducing advantage is realized by providing very thin magnetic layers to be switched. Because the switching field is dependent upon the thickness of the layer being switched, providing several thin layers that all switch at the same smaller magnetic field requires less current than switching one thick layer with a much higher magnetic field.

Thus, several embodiments are illustrated and disclosed which substantially reduce the amount of write current required to store a desired logic state in the cell. Also, multi-state, multi-layer magnetic memory cells can be fabricated using well known and well developed semiconductor techniques. The presently disclosed multi-state, multilayer magnetic memory cells are simple and easy to manufacture and use.

While we have shown and described specific embodiments of the present invention, further modifications and improvements will occur to those skilled in the art. We desire it to be understood, therefore, that this invention is not limited to the particular forms shown and we intend in the appended claims to cover all modifications that do not depart from the spirit and scope of this invention.

What is claimed is:

1. A multi-state, multi-layer magnetic memory cell comprising a plurality of rectangularly shaped layers of magnetoresistive magnetic material stacked in parallel, overlying relationship and separated by layers of non-magnetic material, each of the layers of magnetoresistive magnetic material having a width that is less than a width of magnetic domain walls within the layer of magnetic material so that magnetic vectors in the layers of magnetic material point substantially along a length of the layers of magnetic material, each of the plurality of layers of magnetoresistive magnetic material having opposed edges extending along the length thereof and an accumulation of poles or pole effects along the edges during switching of the magnetic vectors within each of the plurality of layers of magnetoresistive magnetic material and the magnetic vectors rotating laterally in opposite directions during switching, the stacked layers defining a central plane parallel with the stacked layers, and the plurality of layers of magnetic material being formed and positioned on either side of the central plane so as to form a symmetrical stack about the central plane and produce mutual cancellation of the accumulation of poles or pole effects along the edges whereby switching current is reduced.

2. A multi-state, multi-layer magnetic memory cell as claimed in claim 1 wherein the layers of non-magnetic material are formed with non-magnetic, electrically conductive material.

3. A multi-state, multi-layer magnetic memory cell as claimed in claim 1 wherein the layers of non-magnetic material are formed with non-magnetic, electrically insulative material.

4. A multi-state, multi-layer magnetic memory cell as claimed in claim 1 wherein the layers of non-magnetic material are formed with non-magnetic, electrically conductive and electrically insulative material.

5. A multi-state, multi-layer magnetic memory cell as claimed in claim 1 wherein the plurality of layers of magnetic material includes two substantially similar layers positioned on opposite sides of the central plane, the two substantially similar layers being separated by a layer of non-magnetic material with a thickness which allows the mutual cancellation of pole effects during switching of magnetization vectors in the two substantially similar layers.

6. A multi-state, multi-layer magnetic memory cell as claimed in claim 5 wherein the thickness of the layer of non-magnetic material separating the two substantially similar layers is in a range of approximately 3 Å–100 Å.

7. A multi-state, multi-layer magnetic memory cell comprising two substantially similar layers of magnetoresistive magnetic material positioned in parallel, overlying relationship and separated by a layer of non-magnetic material, each of the layers of magnetoresistive magnetic material having a width that is less than a width of magnetic domain walls within the layer of magnetic material so that magnetic vectors in the layers of magnetic material point substantially along a length of the layers of magnetic material each of the layers of magnetoresistive magnetic material having opposed edges extending along the length thereof and an accumulation of poles or pole effects along the edges during switching of the magnetic vectors within each of the layers of magnetoresistive magnetic material and the magnetic vectors rotating laterally in opposite directions during switching, the two substantially similar layers defining a central plane parallel with the two substantially similar layers, and the two substantially similar layers being formed and positioned symmetrically on either side of the central plane to produce mutual cancellation of the accumulation of poles or pole effects along the edges whereby switching current is reduced.

8. A multi-state, multi-layer magnetic memory cell as claimed in claim 7 wherein the two substantially similar layers of magnetic material are formed and positioned to be switched simultaneously with a single magnetic field.

9. A multi-state, multi-layer magnetic memory cell as claimed in claim 8 wherein the two substantially similar layers of magnetic material are separated by the layer of non-magnetic material with a thickness which allows the mutual cancellation of pole effects during simultaneous switching of magnetic vectors in the two substantially similar layers.

10. A multi-state, multi-layer magnetic memory cell as claimed in claim 9 wherein the thickness of the layer of non-magnetic material separating the two substantially similar layers is in a range of approximately 3 Å–100 Å.

11. A multi-state, multi-layer magnetic memory cell comprising two substantially similar layers of magnetoresistive magnetic material positioned in parallel, overlying relationship and separated by a layer of non-magnetic material, each of the two substantially similar layers having a width that is less than a width of magnetic domain walls within the layer of magnetic material so that magnetic vectors in the two substantially similar layers point substantially along a length of the two substantially similar layers, each of the layers of magnetoresistive magnetic material having opposed edges extending along the length thereof and an accumulation of poles or pole effects along the edges during switching of the magnetic vectors within each of the layers of magnetoresistive magnetic material, the two substantially similar layers defining a central plane parallel with the two substantially similar layers, the two substantially similar layers being formed and positioned to be switched simultaneously with a single magnetic field and further formed and positioned symmetrically on either side of the central plane, the magnetic vectors rotating laterally in opposite directions during simultaneous switching, and the layer of non-magnetic material having a thickness which allows mutual cancellation of the accumulation of poles or pole effects during simultaneous switching of magnetic vectors in the two substantially similar layers whereby switching current is reduced.

12. A multi-state, multi-layer magnetic memory cell as claimed in claim 11 wherein the thickness of the layer of non-magnetic material separating the two substantially similar layers is in a range of approximately 3 Å–100 Å.

13. A multi-state, multi-layer magnetic memory cell as claimed in claim 11 wherein the layer of non-magnetic material is formed with non-magnetic, electrically conductive material.

14. A multi-state, multi-layer magnetic memory cell as claimed in claim 11 wherein the layer of non-magnetic material is formed with non-magnetic, electrically insulative material.

15. A multi-state, multi-layer magnetic memory cell as claimed in claim 11 wherein the layer of non-magnetic material is formed with non-magnetic, electrically conductive and electrically insulative material.

16. A multi-state, multi-layer magnetic memory cell comprising two layers of magnetoresistive magnetic material positioned in parallel, overlying relationship and separated by a layer of non-magnetic material, each of the layers of magnetoresistive magnetic material having a width that is less than a width of magnetic domain walls within the layer of magnetic material so that magnetic vectors in the layers of magnetic material point substantially along a length of the layers of magnetic material, each of the layers of magnetoresistive magnetic material having opposed edges extending along the length thereof and an accumulation of poles or pole effects along the edges during switching of the magnetic vectors within each of the layers of magnetoresistive magnetic material and the magnetic vectors rotating laterally in opposite directions during switching, the two layers of magnetic material defining a central plane parallel with the two layers of magnetic material, and the two layers of magnetic material being formed and positioned relative to the central plane to each produce symmetrical magnetic vectors with similar characteristics so as to mutually cancel the accumulation of poles or pole effects during simultaneous switching of the magnetic vectors in the two layers of magnetic material whereby switching current is reduced.

* * * * *